US012418307B2

(12) United States Patent
Ersoy et al.

(10) Patent No.: US 12,418,307 B2
(45) Date of Patent: Sep. 16, 2025

(54) RETURN TO OPEN DAC WITH RESISTOR BYPASS ON RESET

(71) Applicant: NXP B.V., Eindhoven (NL)

(72) Inventors: Selcuk Ersoy, Eindhoven (NL); Dobson Paul Parlindungan Simanjuntak, Eindhoven (NL); Robert van Veldhoven, Valkenswaard (NL)

(73) Assignee: NXP B.V., Eindhoven (NL)

( * ) Notice: Subject to any disclaimer, the term of this patent is extended or adjusted under 35 U.S.C. 154(b) by 234 days.

(21) Appl. No.: 18/313,414

(22) Filed: May 8, 2023

(65) Prior Publication Data

US 2024/0380413 A1 Nov. 14, 2024

(51) Int. Cl.
*H03M 3/00* (2006.01)

(52) U.S. Cl.
CPC ........... *H03M 3/464* (2013.01); *H03M 3/346* (2013.01)

(58) Field of Classification Search
CPC .............................. H03M 3/464; H03M 3/346
USPC ........................................................ 341/143
See application file for complete search history.

(56) References Cited

U.S. PATENT DOCUMENTS

| 7,414,557 | B2 * | 8/2008 | Andersson | ............ | H03M 3/464 |
| | | | | | 341/120 |
| 8,324,969 | B2 * | 12/2012 | Loeda | .................. | H03G 1/0088 |
| | | | | | 716/133 |

OTHER PUBLICATIONS

Wu, S., "A Current-Sensing Front-End Realized by A Continuous-Time Incremental ADC with 12b SAR Quantizer and Reset-Then-Open Resistive DAC Achieving 140dB DR and 8ppm INL at 4kS/s", 2020 IEEE International Solid-State Circuits Conference, ISSCC 2020, Session 9 / Noise-Shaping ADCs / 9.1, Feb. 16-20, 2020.

Pun, K., "A 0.5-V 74-dB SNDR 25-KHz Continuous-Time Delta-Sigma Modulator With a Return-to-Open DAC", IEEE Journal of Solid-State Circuits, vol. 42, No. 3, Mar. 2007.

Theertham, R., "Design Techniques for High-Resolution Continuous-Time Delta-Sigma Converters With Low In-Band Noise Spectral Density", IEEE Journal of Solid-State Circuits, vol. 55, No. 9, Sep. 2020.

Theertham, R., "Design of High-Resolution Continuous-Time Delta-Sigma Data Converters With Dual Return-to-Open DACs", IEEE Journal of Solid-State Circuits, vol. 57, No. 11, Nov. 2022.

* cited by examiner

*Primary Examiner* — Khai M Nguyen
(74) *Attorney, Agent, or Firm* — David G. Dolezal

(57) ABSTRACT

An analog to digital circuit that includes a feedback circuit with a return to open (RTO), digital to analog converter (DAC) that provides an analog signal that is indicative of an output of an ADC component of the ADC. During a data phase, the output of the DAC is provided to a combiner input through a resistive circuit. The combiner also receives an analog input signal at another input and provides a combined output signal to the ADC component. During a reset phase, the output of the DAC is provided to the combiner through a lower resistance bypass circuit to bypass the resistive circuit.

20 Claims, 5 Drawing Sheets

RETURN TO OPEN DAC WITH RESISTOR BYPASS ON RESET

BACKGROUND OF THE INVENTION

Field of the Invention

This invention relates to analog to digital converters with a feedback circuit having a resistive circuit bypass on reset.

Background

An analog to digital converter (ADC) is utilized to produce a digital representation of an analog input signal. A sigma delta ADC utilizes sigma delta modulation to convert an analog signal to a digital signal by selectively producing a series of pulses where the density of the selectively produced series of pulses is indicative of the voltage of the analog signal. In some examples, of a sigma delta ADC, the pulses are provided to one or more digital to analog converters (DAC) in one or more feedback loops where the output of a DAC is combined with an analog signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

Figure 1:
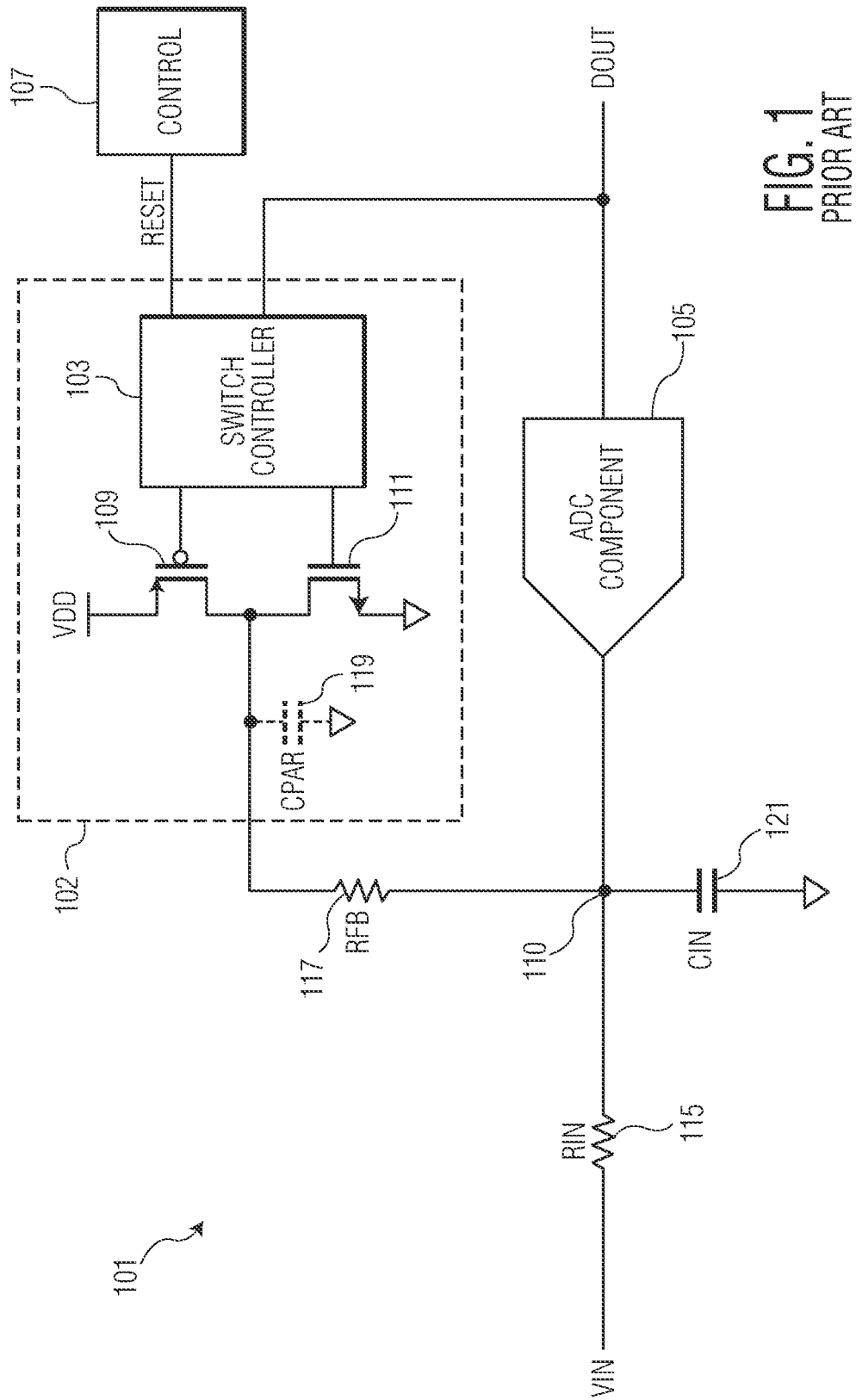
FIG. 1 is a circuit diagram of a prior art ADC.

The following sets forth a detailed description of a mode for carrying out the invention. The description is intended to be illustrative of the invention and should not be taken to be limiting.

Disclosed herein is an analog to digital circuit that includes a feedback circuit with a return to open (RTO), digital to analog converter (DAC) that provides an analog signal that is indicative of an output of an ADC component of the ADC. During a data phase, the output of the DAC is provided to a combiner input through a resistive circuit. The combiner also receives an analog input signal at another input and provides a combined output signal to the ADC component. During a reset phase, the output of the DAC is provided to the combiner through a lower resistance bypass circuit to bypass the resistive circuit.

In some embodiments, utilizing a lower resistance bypass circuit during a reset phase may provide for a feedback circuit where charge stored on the parasitic capacitance of the feedback circuit is more effectively changed during the reset phase to be less data dependent. Accordingly, error due to the prior state dependent charge stored on the parasitic capacitance of the feedback circuit may be reduced. Also, such a bypass circuit may also allow for a shorter reset phase with respect to the data phase.

An ADC is used to convert an analog signal to a digital signal. One type of ADC is a sigma delta ADC. Some ADCs include an ADC component and a feedback DAC to implement sigma delta modulation for providing a digital representation of an analog input signal. During operation, the DAC output signal is combined with an input signal in order to minimize the integrated error.

One issue in utilizing a DAC for an ADC is inter symbol interference (ISI). A DAC requires a certain amount time to switch between output states. During this time, the feedback signal may change. Since the number of transitions of the DAC output are dependent on the data itself, the feedback signal may become self-modulated and residual data dependent. For example, in a DAC with residual data dependency issues, the average voltage of an output series of '0-0-1-1' is not the same as the average voltage of an output series of '0-1-0-1' due to the different number of transitions for each series. Residual data dependency issues may cause significant non-linearity, especially with single bit DAC's.

Different techniques may be used to address these non linearity issues. In some instances, a return to zero (RTZ), single bit DAC may be used. With a return to zero DAC, the DAC output is reset after each data pulse to ensure that every DAC pulse is the same, regardless of the previous data state. However, a return to zero DAC requires a reference level for resetting which adds to circuit complexity and may reduce energy efficiency.

Another type of DAC is a return to open (RTO) DAC. With an RTO DAC, the DAC output is not reset to a known level, but is instead set to a high impedance state. An RTO DAC has a simpler design than a RTZ DAC in that a reference level is not utilized for resetting the DAC output. Also, RTO DACs may be more power efficient. An RTO DAC also generates data independent feedback current. However, conventional RTO DACs may suffer from reset issues as described below.

FIG. 1 is a circuit diagram of a sigma delta ADC 101 that includes an ADC component 105 for producing a digital representation (DOUT) of an analog input signal (VIN) and a feedback circuit that includes a single bit DAC 102 for providing an analog signal representative of DOUT to combiner node 110 through feedback resistor 117. Combiner node 110 receives the analog input signal VIN through input resistor 115. Combiner node 110 is also coupled to input capacitor 121. In one embodiment, VIN is received from a sample and hold circuit (not shown).

During a data phase of operation, if DOUT is at a first voltage state, switch controller 103 of DAC 102 makes PFET 109 conductive to provide VDD at the output of DAC 102, and if DOUT is at a second voltage state, controller 103 makes NFET 111 conductive to provide a ground voltage at the output of DAC 102. During a reset phase, both PFET 109 and NFET 111 are open to provide a high impedance state. The reset phase is defined by a RESET signal from control circuit 107. Because DAC 102 is an RTO DAC, the output of DAC 102 is not set to a reference voltage during a reset phase, thereby simplifying the design and reducing power consumption.

In addition, it may be desirable in an ADC to minimize the time of the reset phase with respect to the data phase. A relatively short reset phase reduces the effect of the high impedance state of an RTO DAC on the overall gain of the ADC. Furthermore, reducing the time of the reset phase reduces the effect of errors in the reset phase timing with respect to the operation of an ADC.

However, one issue with using an RTO DAC in an ADC is that parasitic capacitance of the feedback circuit (represented by dashed capacitor symbol CPAR 119 in FIG. 1) may not be discharged or charged to a non data dependent level fast enough in a relatively short reset phase. Accordingly, such an issue may cause the feedback signal utilizing an RTO DAC to exhibit residual data dependency in that the charge on the parasitic capacitance is dependent on previous data states. Although RTZ DACs may not have such a problem, their more complex design and reduced power efficiency make their implementation less desirable.

Figure 2:
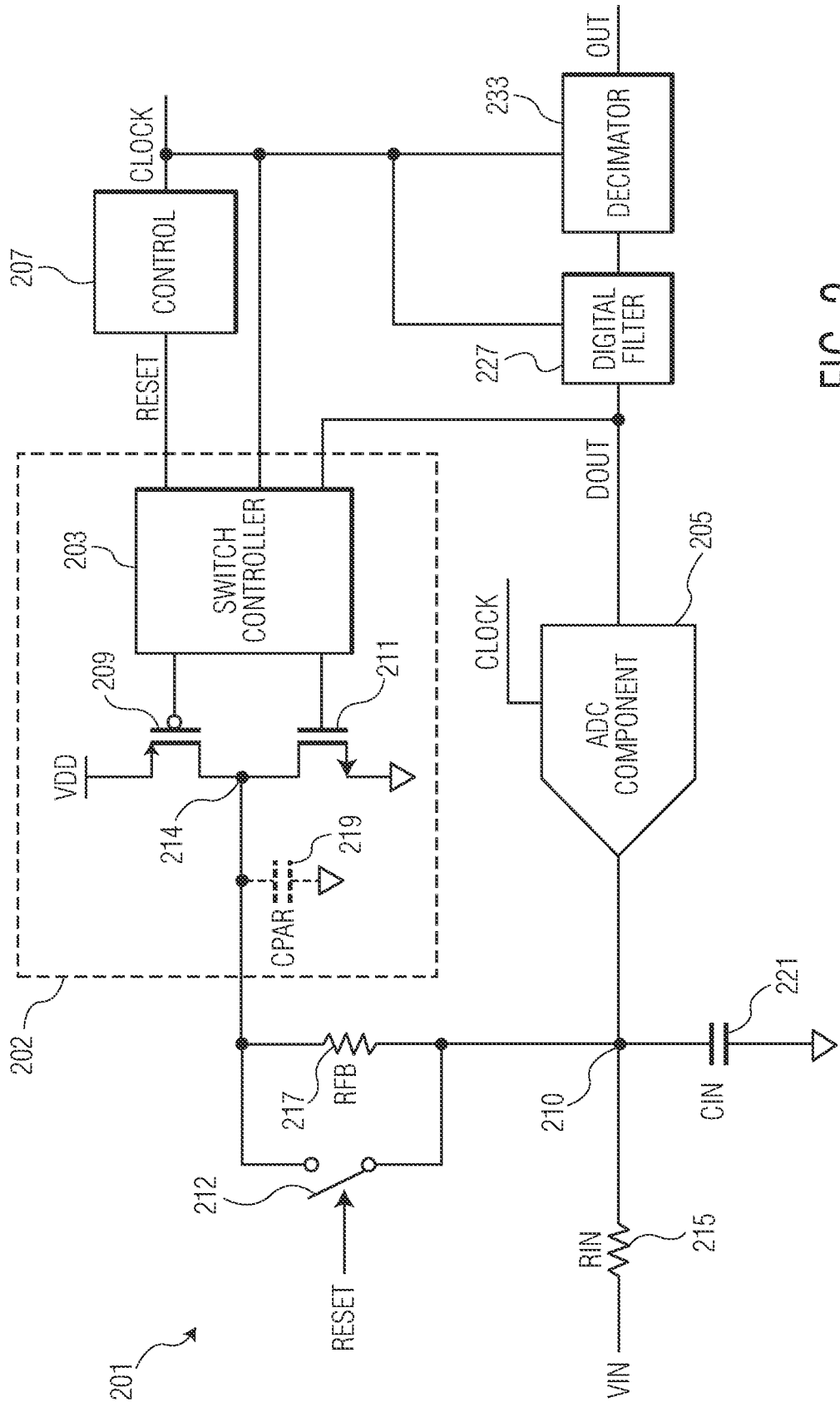
FIG. 2 is a circuit diagram of an ADC according to one embodiment of the present invention.

FIG. 2 is a circuit diagram of an ADC according to one embodiment of the present invention. As will be described below, ADC 201 implements a feedback circuit with a resistive bypass circuit for adjusting (discharging or charging) the charge on the parasitic capacitance of the feedback circuit during a reset phase to improve the performance of the ADC.

In the embodiment of FIG. 2, ADC 201 is a sigma delta ADC that receives a single ended analog input signal (VIN) and provides a digital signal OUT indicative of the voltage of VIN. In one embodiment, VIN is received from a sample and hold circuit (not shown), but may be received from other circuits in other embodiments. ADC 201 includes an ADC component 205 that includes a loop filter and a comparator (not shown in FIG. 2 but described below with respect to FIG. 5) that provides a digital signal DOUT indicative of the voltage of VIN. ADC 201 also includes feedback circuit with an RTO single bit DAC 202 and feedback resistor 217.

During a data phase, DAC 202 receives DOUT and provides a feedback signal through feedback resistor 217 to an input of combiner node 210 indicative of the output state of DOUT. The feedback signal is combined with the analog input signal (VIN) provided through input resistor 215 to a second input of combiner node 210. The combined signal is applied to ADC component 205 where ADC component 205 performs sigma delta modulation operations to produce DOUT. In one embodiment, a loop filter (not shown in FIG. 2) of ADC component 205 adds the combined signal to a combined value of a previous operation of the loop filter, and a comparator (not shown in FIG. 2) of ADC component 205 outputs a pulse if the output of the loop filter is greater than a reference value (e.g., ground) or no pulse if the output of the loop filter is less than the reference. In one embodiment, the density of the pulses at DOUT is indicative of a voltage of the analog input signal (VIN).

In the embodiment shown, ADC 201 includes a digital filter 227 for filtering DOUT and a decimator 233 for providing the OUT signal. In some embodiments, decimator 223 includes a counter (not shown) for counting the number of pulses during a summation period, where the number of pulses is indicative of the voltage of VIN. In the embodiment shown, the CLOCK signal is supplied to control circuit 207, controller 203, ADC component 205, digital filter 227, and decimator 233.

In some embodiments, the loop frequency of ADC 201 (the frequency at which the comparator of component 205 makes a comparison to selectively generate a pulse at DOUT), is significantly higher than the data output frequency of decimator 233 (the inverse of the summation period). In one embodiment, the loop frequency of converter 201 is 25 MHz of and the data output frequency of decimator 233 is 24 KHz. However, these frequencies may be of other values in other embodiments.

In the embodiment shown, single bit DAC 202 includes two drive switches (PFET 209 and NFET 211) that are selectively activated by the logic of switch controller 203 during a data phase of operation to provide either one of two voltages (e.g., VDD, Ground) at DAC output 214. The voltage provided is dependent upon the voltage of DOUT during a data phase. For example, if DOUT is at a high voltage value based on an internal comparison by component 205, NFET 211 is made conductive to pull output 214 to ground. If DOUT is at a low voltage value based on an internal comparison, PFET 209 is made conductive to pull output 214 to VDD. In one embodiment, VDD is 1.5 volts, but may be of other voltage values in other embodiments. In other embodiments, other voltages including a negative voltage may be utilized in place of ground.

During a data phase, the signal from output 214 is applied to an input of summing node 210 through feedback resistor (RFB) 217. The VIN signal is applied to an input of combiner node 210 through input resistor (RIN) 215. In one embodiment, resistors 217 and 215 have resistance value of 10 K ohms to set the currents of the VIN signal and the Feedback signal that are combined at node 210, However, these resistances may be of other values in other embodiments. Because output 214 of DAC 202 is inverted from the output state of DOUT in the embodiment shown, combiner node 210 "effectively subtracts" the voltage state of DOUT from the voltage of VIN in the next cycle.

During a reset phase (as indicated by the assertion of the RESET signal in FIG. 2), both NFET 211 and PFET 209 are nonconductive to provide output 214 with a high impedance state.

The feedback circuit of ADC 201 has a bypass circuit, that when enabled by closed switch 212 during a reset phase, provides a lower resistance path (e.g., an electrical short) of output 214 of DAC 202 to an input of combiner node 210, thereby bypassing the higher resistance path of feedback resistor 217. This lower resistance bypass circuit discharges or charges the parasitic capacitance 219 (shown as dashed capacitor symbol CPAR 219) of the feedback circuit with a voltage of node 210 during a reset phase. In one embodiment, if the previous data phase voltage of DAC 202 was VDD, then the lower resistance bypass circuit would discharge capacitance 219 to a particular level or range. If the previous data phase voltage of DAC 202 was ground, then the lower resistance bypass circuit would charge capacitance 219 to the particular level or range. Accordingly, in one embodiment during a reset phase, the lower resistance bypass circuit more rapidly adjusts the charge of the parasitic capacitance to a non previously data state dependent level. In some instances, the voltage of node 210 may exhibit some previous data state dependency during the reset phase. However, because the amplitude of the voltage may be low, the effect on ADC 201 of the previous data state dependency is negligible. In one embodiment, the charge on parasitic capacitance 219 is set by the charge on input capacitor 221. In one embodiment capacitor 221 acts to smooth the voltage of VIN and has a capacitance of 50 pF which is significantly larger than the parasitic capacitance 219 of the feedback circuit. However, the capacitance of capacitor 221 may be different in other embodiments. In one embodiment, the parasitic capacitance 219 represents the capacitance of PFET 209, NFET 211 and the signal line capacitance of the feedback circuit. In one embodiment, switch 212 is implemented with an NFET, but may be implemented with other types of switches, such as a passgate, in other embodiments.

In some embodiments, by providing a bypass path during a reset phase, the voltage of the parasitic capacitance 219 is more quickly adjusted by the voltage of the combiner node 210 (e.g., based on the charge of input capacitor 221 in some embodiments) to reduce the residual data dependent voltage of the feedback signal due to charge stored on parasitic capacitance CPAR 219. This change in charge on the parasitic capacitance through the bypass circuit may reduce inter symbol interference and shorten the time needed for the reset phase. Such a feature may allow an ADC to be implemented with a less complex RTO DAC (e.g., 202) as opposed to a more complex RTZ DAC, which may reduce circuit complexity and power consumption.

An ADC as described herein may have other configurations, other devices, and/or operate in other manners. For example, although ADC 201 is described as performing sigma delta modulation, an ADC may perform other analog to digital conversion techniques for providing digital data including other delta modulation techniques. Furthermore, although resistance in the feedback circuit is implemented with resistor 217 in FIG. 2, other types of resistive circuits may be used. For example, the feedback circuit may include a resistive circuit with multiple resistors where the resistance is trimmable. Furthermore, DAC 202 may have other configurations and/or devices (e.g., as including a compensation DAC or chopper circuits). In the embodiment of FIG. 2, the analog input signal VIN and feedback signal are combined at combiner node 210. However, in other embodiments, other types of combiners may be utilized such as a summing amplifier, a differentiating amplifier, or a summing integrator.

Figure 3:
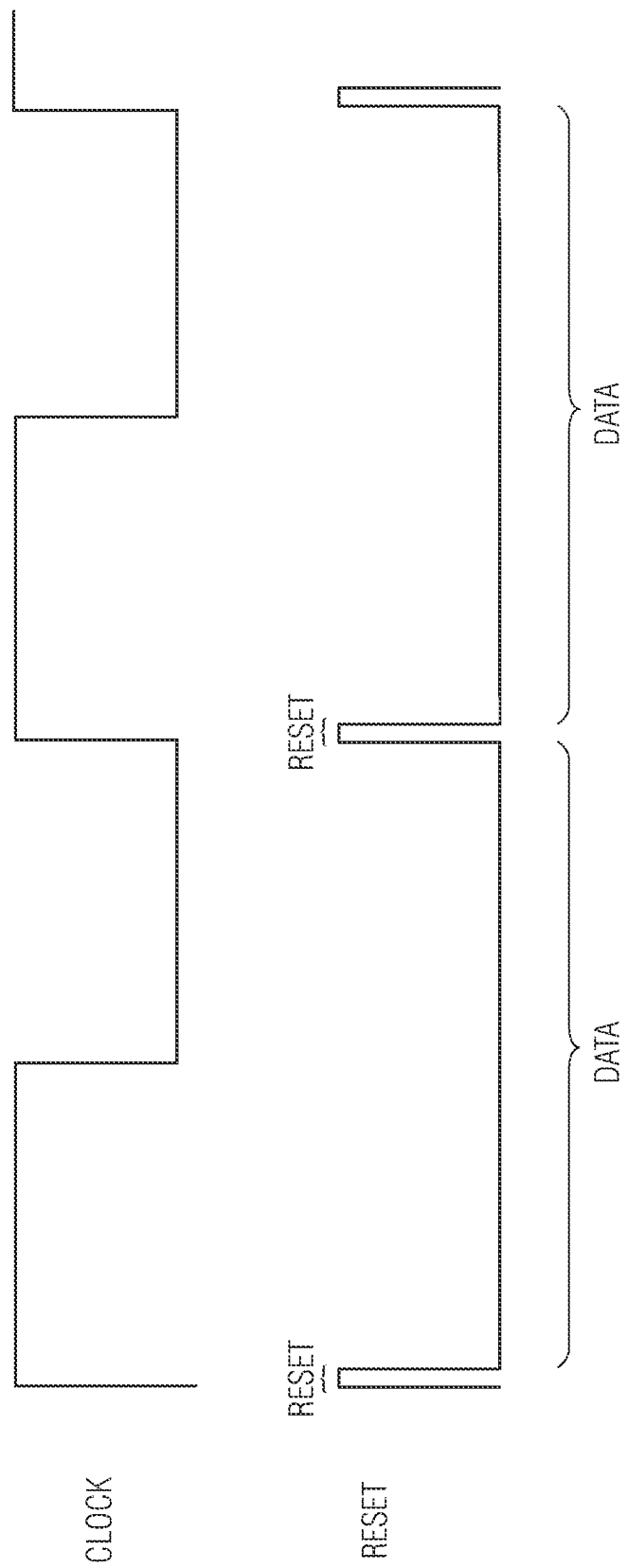
FIG. 3 is a timing diagram showing operations of the ADC of FIG. 2 according to one embodiment of the present invention.

FIG. 3 is a timing diagram showing occurrences of the reset phase and the data phase with respect to the CLOCK signal. In one embodiment, the reset phase occurs when the RESET signal is asserted and the data phase occurs when the RESET signal is not asserted. During the reset phase, output 214 of DAC 202 is placed in a high impedance state and the reset bypass path is enabled by closing switch 212. During a data phase, DAC 202 provides a voltage at output 214 that is indicative of the output state of DOUT. Because switch 212 is open during the data phase, output 214 is coupled through feedback resistor 217 to combiner node 210 where its feedback signal is combined with the analog input signal (VIN) and provided to the input of ADC component 205. In the embodiment shown, during a single data phase, component 205 provides DOUT at a high voltage state to indicate a positive comparison and at a low voltage state to indicate a negative comparison taking place during the duty cycle. In one embodiment, the density of the high voltage state pulses per the number of data phase occurrences is an indication of the analog input voltage (VIN). In one embodiment, the CLOCK signal has a frequency of 25 MHZ, and the reset phase has a time period of 200 Pico second with the data phase time period occurring during the remaining portion of the clock cycle period. However, these time periods and frequencies may be of other values in other embodiments.

In one embodiment, control circuit 207 generates the reset pulse of the RESET signal using a delay circuit (e.g., an inverter chain—not shown) to produce a delayed clock signal that is compared with the clock signal to generate reset pulses whose pulse length is determined by the delay of the delay chain. Accordingly, in some embodiments, the length of the reset pulse is dependent upon process, voltage, and temperature conditions, where some variation in pulse width may be expected. Such variation may affect the gain of the ADC. However, in embodiments where the reset pulse width is a significantly small percentage (e.g., less than 5%) of the total clock cycle period, the variation in pulse spread will have a relatively small effect on the gain of the ADC. In one embodiment, the time period of a reset phase is 6% or less the time period of a data phase. However, this percentage may be dependent upon clock frequency. Also, in some embodiments, controller 203 is configured such that the change in phase of DAC 202 is triggered on the rising edge of the reset pulse, thereby reducing jitter effects. However, control circuit 207 may generate the reset pulse and/or DAC 202 may respond to the reset pulse in different ways in other embodiments.

In some simulations where the reset phase time period is set to 200 ps and the clock frequency is 25 MHZ, the ADC gain linearity increases from 94.5 dB total harmonic distortion (THD) to 112.6 dB THD when a resistor bypass path is implemented with an RTO single bit DAC. However, other embodiments with different implementations may produce other improvements in THD.

Figure 4:
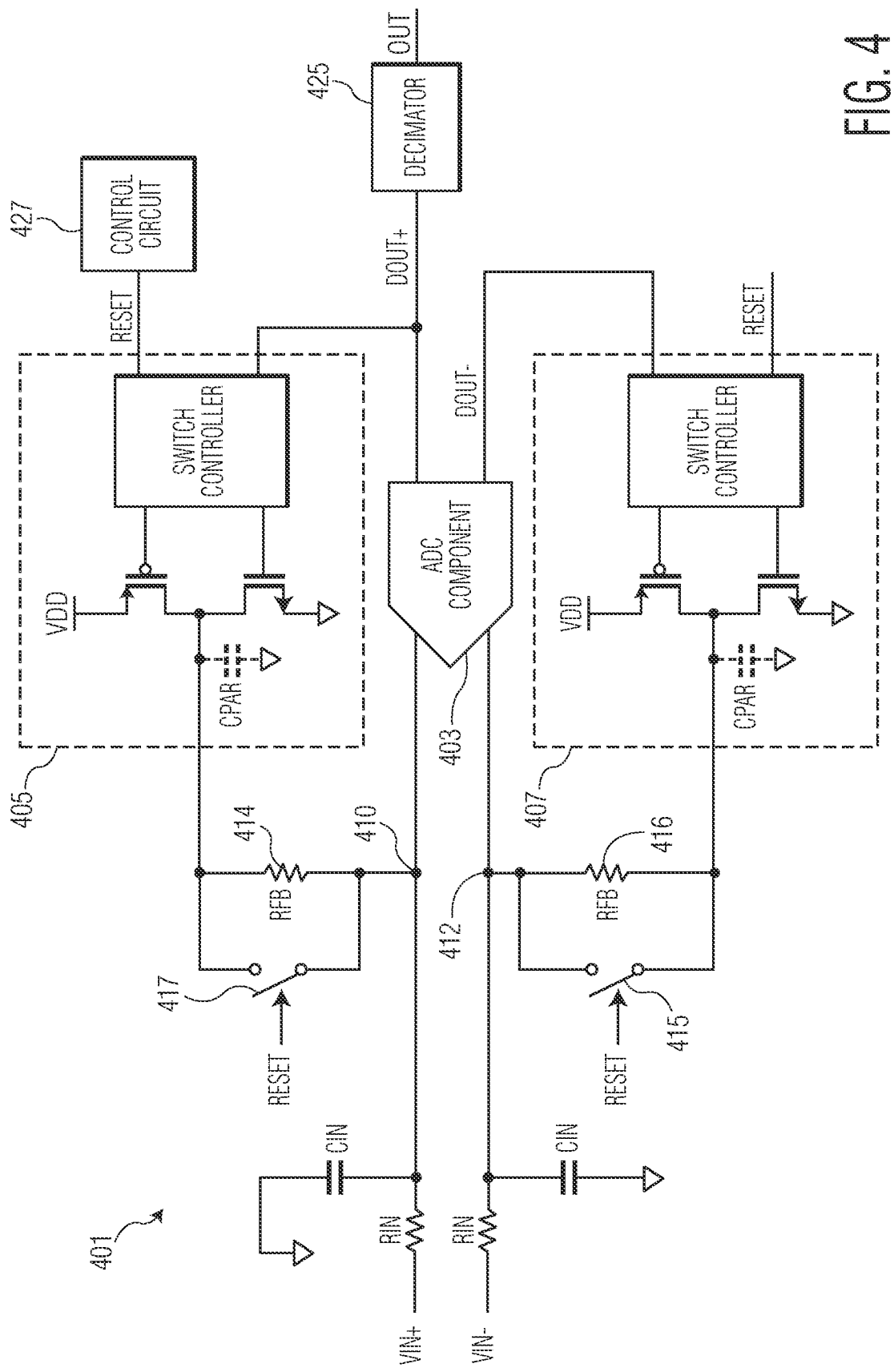
FIG. 4 is a circuit diagram of an ADC according to another embodiment of the present invention.

FIG. 4 is a circuit diagram of an ADC 401 according to another embodiment of the present invention. In one embodiment, ADC 401 is a sigma delta ADC that provides a digital representation (OUT) of a differential analog input signal formed from complementary analog input signals VIN+ and VIN−. ADC component 403 produces two complementary digital output signals DOUT+ and DOUT− that form a differential digital output signal. ADC 401 includes two feedback circuits. One feedback signal includes single bit RTO DAC 405, feedback resistor 414 and bypass switch 417 for providing a feedback signal to combiner node 410 that is combined with analog input signal VIN+. During a data phase, this feedback circuit provides an analog signal to combiner node 410 indicative of the output state of the digital output signal DOUT+. The other feedback circuit includes single bit RTO DAC 407, feedback resistor 416, and bypass switch 415 for providing a feedback signal to combiner node 412 that is combined with analog input signal VIN−. During a data phase, this feedback circuit provides an analog signal to combiner node 412 indicative of the output state of the digital output signal DOUT−. During a reset phase, the bypass switches 417 and 415 are closed by an asserted RESET signal to bypass feedback resistors 414 and 416, respectively, for adjusting parasitic capacitances of the respective feedback circuits (as indicated by the dashed capacitance symbol CPAR). The RESET signal is provided by control circuit 427. The DOUT+ signal is provided to a decimator 425 to produce the OUT signal.

In some embodiments, ADC component 403 is configured to have a single ended output where DAC 407 would include an inverter (not shown) to invert the DOUT+ signal. In other embodiments, ADC 401 may include other circuitry, have other configurations, and/or operate in other ways, including the modifications described above with respect to FIG. 2.

Figure 5:
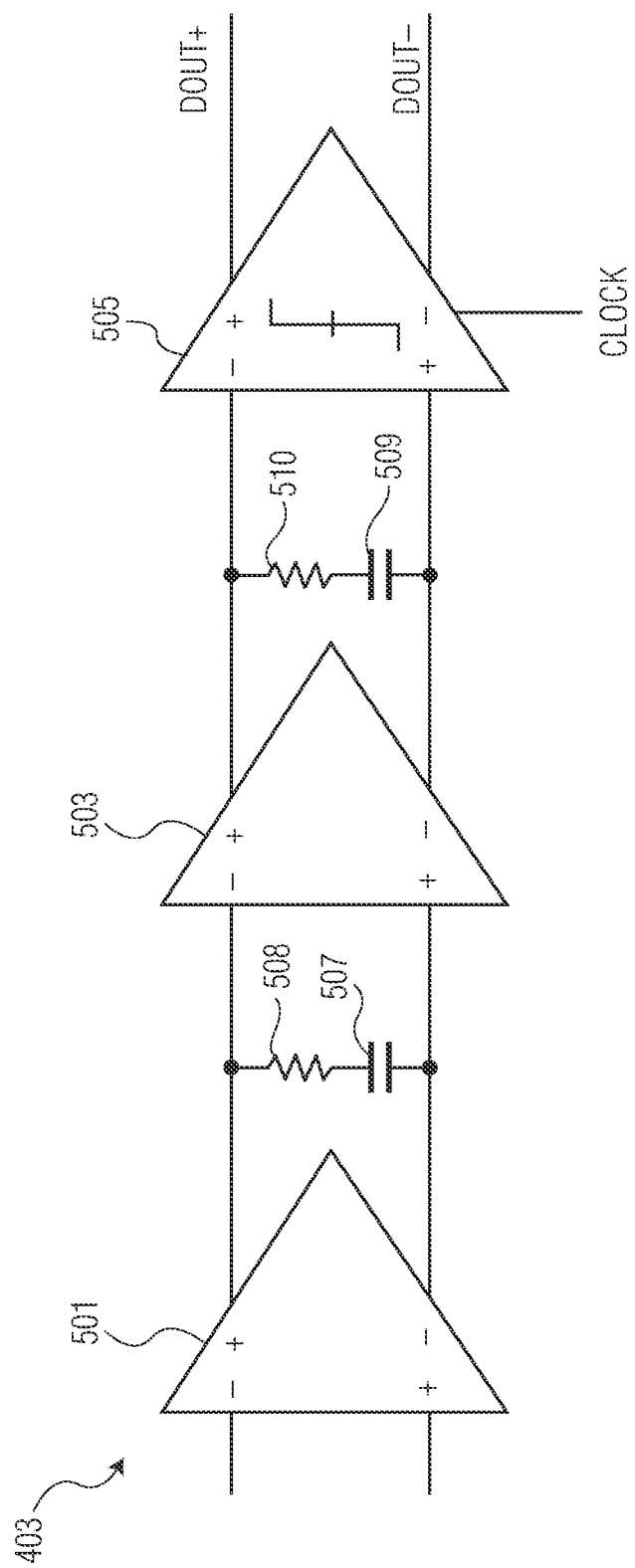
FIG. 5 is a circuit diagram of an ADC component according to one embodiment of the present invention.

FIG. 5 is a circuit diagram of ADC component 403 according to one embodiment. In the embodiment shown, ADC component 403 has a second order loop filter that includes amplifiers 501 and 503. The noninverting output of amplifier 501 is connected to the inverting input of amplifier 503 and the inverting output of amplifier 501 is connected to the noninverting input of amplifier 503. Capacitor 507 and resistor 508 are connected in series between the differential inputs of amplifier 503.

Component 403 also includes a differential single bit comparator 505 whose inverting input is connected to the noninverting output of amplifier 503 and whose noninverting input is connected to the inverting output of amplifier 503. Capacitor 509 and resistor 510 are connected in series between the differential inputs of comparator 505. Comparator 505 also receives the CLOCK signal. Where an ADC component has a single ended input (such as ADC component 205 in FIG. 2), the non inverting input of amplifier 501 would be connected to a reference level.

An ADC component may have other configurations in other embodiments. For example, ADC component 403 may include a first order loop filter, or a third or fourth order loop filter. Furthermore, component 403 may include internal feedback loops (not shown). In some embodiments, each internal feedback loop would include a single bit RTO DAC with a resistor bypass circuit (similar to that shown in FIG. 2).

In some embodiments, a feedback circuit with a RTO DAC, a resistive circuit, and a reset bypass circuit for the resistive circuit could be implemented in other types of feedback loops for other types of ADCs. In still other embodiments, reset bypass circuits may be utilized for feedback circuits with multibit DACs.

In some embodiments, the ADCs shown or described herein may be implemented in communications systems or other types of systems for analog to digital conversion. In some embodiments, the ADC can be used for audio conversion in a microphone or for sensor readout Providing an ADC with a feedback circuit including a single bit RTO DAC with a resistor bypass circuit may provide, in some embodiments, a simplified energy efficient feedback circuit with a shortened reset phase where charge stored in the parasitic capacitance of the feedback circuit can be quickly adjusted to reduce the effects of inter symbol interference due to residual data dependencies.

Features described herein with respect to one embodiment may be implemented in other embodiments described herein. A current electrode of a FET (field effect transistor) is a source or drain. A control electrode of a FET is a gate.

In one embodiment, an analog to digital converter (ADC) includes an analog to digital converter (ADC) component and a combiner. The combiner includes a first input coupled to receive an analog input signal, a second input, and an output. The output of the combiner is coupled to an input of the ADC component. The ADC includes a feedback circuit. The feedback circuit includes a digital to analog converter (DAC) including an input coupled to an output of the ADC component wherein the DAC is characterized as a return to open DAC wherein an output of the DAC is at a high impedance state during a reset phase. The feedback circuit includes a resistive circuit including a first terminal coupled to the output of the DAC and a second terminal coupled to the second input of the combiner to provide a resistance between the output of the DAC and the second input of the combiner during a data phase. The feedback circuit includes a reset bypass circuit that when enabled during the reset phase provides a bypass path between the output of the DAC and the second input of the combiner of a lessor resistance than the resistance of the resistive circuit.

In another embodiment, a method for converting an analog signal to a digital signal includes in a data phase, producing by an output of a digital to analog converter (DAC) of a feedback circuit, an analog signal indicative of a voltage state produced by an analog to digital converter (ADC) component, wherein the DAC is characterized as a return to open DAC. The method includes in the data phase, providing through a resistive circuit, the analog signal produced by the DAC to a first input of a combiner, wherein the resistive circuit provides a resistance to the analog signal produced by the DAC. The method includes in the data phase, providing an analog input signal to a second input of the combiner and providing an output of the combiner to an input of the ADC component. The method includes in a reset phase, enabling a reset bypass path from the output of the DAC to the first input of the combiner, where the reset bypass path has a lower resistance than the resistance of the resistive circuit, wherein the output of the DAC is at a high impedance state during the reset phase.

In another embodiment, a feedback circuit for an analog to digital converter (ADC) includes a digital to analog converter (DAC) including an output for providing an analog signal representative of digital signal received at an input of the DAC during a data phase, wherein the DAC is characterized as a return to open DAC wherein the output of the DAC is at a high impedance state during a reset phase. The feedback circuit includes a resistive circuit including a first terminal coupled to the output of the DAC and a second terminal coupled to a node of an ADC to provide a resistance between the output of the DAC and the node during a data phase. The feedback circuit includes a reset bypass circuit that when enabled during the reset phase, provides a bypass path between the output of the DAC and the node of a lessor resistance than the resistance of the resistive circuit.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An analog to digital converter (ADC) comprising:
   an analog to digital converter (ADC) component;
   a combiner, including a first input coupled to receive an analog input signal, a second input, and an output, the output of the combiner is coupled to an input of the ADC component;
   a feedback circuit comprising:
      a digital to analog converter (DAC) including an input coupled to an output of the ADC component wherein the DAC is characterized as a return to open DAC wherein an output of the DAC is at a high impedance state during a reset phase;
      a resistive circuit including a first terminal coupled to the output of the DAC and a second terminal coupled to the second input of the combiner to provide a resistance between the output of the DAC and the second input of the combiner during a data phase;
      a reset bypass circuit that when enabled during the reset phase provides a bypass path to electrically short the output of the DAC to the second input of the combiner.

2. The ADC of claim 1 further comprising a capacitor coupled to the combiner.

3. The ADC of claim 1, wherein during the reset phase when the output of the DAC is at a high impedance state, a charge level of a parasitic capacitance of the feedback circuit is adjusted through the bypass path.

4. The ADC of claim 1 wherein the ADC utilizes sigma delta modulation to produce a series of pulses whose density is indicative of the voltage of the analog input signal.

5. The ADC of claim 4 wherein each pulse of the series of pulses is produced during an occurrence of the data phase.

6. The ADC of claim 1 wherein the combiner is characterized as a node, wherein when enabled, the bypass path electrically shorts the output of the DAC to the node.

7. The ADC of claim 1 further comprising:
   a second combiner, including a first input coupled to receive a second analog input signal, a second input, and an output, the output of the second combiner is coupled to a second input of the ADC component, the second analog input signal is complimentary to the analog input signal to form a differential analog input signal;
a second feedback circuit comprising:
a second DAC including an input coupled to an output of the ADC component wherein the second DAC is characterized as a return to open DAC wherein an output of the second DAC is at a high impedance state during the reset phase;
a second resistive circuit including a first terminal coupled to the output of the second DAC and a second terminal coupled to the second input of the second combiner to provide a resistance between the output of the second DAC and the second input of the second combiner during the data phase;
a second reset bypass circuit that when enabled during the reset phase, provides a bypass path to electrically short the output of the second DAC to the second input of the second combiner.

8. The ADC of claim 1 wherein during the data phase, an output state of the DAC is dependent upon a voltage state of an output of the ADC component, wherein during the data phase, the second input of the combiner is coupled in a current path through the resistive circuit and through the output of the DAC to a first voltage source or is coupled in a current path through the resistive circuit and through the output of the DAC to a second voltage source dependent upon the voltage state of the output of the ADC component, wherein during the data phase, the first voltage source is configured to provide a first voltage and the second voltage source is configured to provide a second voltage that is less than the first voltage.

9. The ADC of claim 1 wherein a time period of the reset phase is 6% or less of a time period of the data phase.

10. A method for converting an analog signal to a digital signal, the method comprising:
in a data phase, producing by an output of a digital to analog converter (DAC) of a feedback circuit, an analog signal indicative of a voltage state produced by an analog to digital converter (ADC) component, wherein the DAC is characterized as a return to open DAC;
in the data phase, providing through a resistive circuit, the analog signal produced by the DAC to a first input of a combiner, wherein the resistive circuit provides a resistance to the analog signal produced by the DAC;
in the data phase, providing an analog input signal to a second input of the combiner and providing an output of the combiner to an input of the ADC component;
in a reset phase, enabling a reset bypass path from the output of the DAC to the first input of the combiner to electrically short the output of the DAC to the first input of the combiner, wherein the output of the DAC is at a high impedance state during the reset phase.

11. The method of claim 10 wherein during the enabling the reset bypass path, a charge level of a parasitic capacitance of the feedback circuit is adjusted through the reset bypass path.

12. The method of claim 10 wherein the method of claim 10 is performed by an analog to digital converter, wherein the analog to digital converter utilizes sigma delta modulation to selectively produce a series of pulses at an output of the analog to digital converter component, wherein a density of the selectively produced series of pulses is indicative of the voltage of the analog input signal.

13. The method of claim 12, wherein each pulse of the series of pulses is produced during an occurrence of the data phase.

14. The method of claim 10 wherein the method of claim 10 is performed by an analog to digital converter that is characterized as a sigma delta analog to digital converter.

15. The method of claim 10 further comprising:
in the data phase, producing by an output of a second digital to analog converter (DAC) of a second feedback circuit, a second analog signal indicative of the voltage state produced by the analog to digital converter (ADC) component, wherein the second DAC is characterized as a return to open DAC;
in the data phase, providing through a second resistive circuit, the second analog signal produced by the second DAC to a first input of a second combiner, wherein the second resistive circuit provides a resistance to the second analog signal produced by the second DAC;
in the data phase, providing a second analog input signal to a second input of the second combiner and providing an output of the second combiner to a second input of the ADC component, wherein the second analog input signal is complementary to the analog input signal and the analog input signal and the second analog input signal form a differential analog input signal;
in the reset phase, enabling a second reset bypass path from the output of the second DAC to the first input of the second combiner to electrically short the output of the second DAC to the first input of the second combiner, wherein the output of the second DAC is at a high impedance state during the reset phase.

16. The method of claim 10 wherein the time period of the reset phase is 6% or less of the time period of the data phase.

17. The method of claim 10 wherein a capacitor is coupled to the combiner.

18. The method of claim 10 wherein the combiner is characterized as a node, wherein enabling the reset bypass path from the output of the DAC to the first input of the combiner electrically shorts the output of the DAC to the node.

19. A feedback circuit for an analog to digital converter (ADC), the feedback circuit comprising:
a digital to analog converter (DAC) including an output for providing an analog signal representative of digital signal received at an input of the DAC during a data phase, wherein the DAC is characterized as a return to open DAC wherein the output of the DAC is at a high impedance state during a reset phase;
a resistive circuit including a first terminal coupled to the output of the DAC and a second terminal coupled to a combiner node of an ADC to provide a resistance between the output of the DAC and the combiner node during a data phase;
a reset bypass circuit that when enabled during the reset phase, provides a bypass path between the output of the DAC and the combiner node to electrically short the output of the DAC to the combiner node.

20. The feedback circuit of claim 19 wherein a capacitor is coupled to the combiner node and wherein during the reset phase when the output of the DAC is at a high impedance state, a charge level of a parasitic capacitance of the feedback circuit is adjusted through the bypass path.

* * * * *